US005307018A

United States Patent [19]
Gadgil

[11] Patent Number: 5,307,018
[45] Date of Patent: Apr. 26, 1994

[54] APPARATUS AND METHOD TO DETECT AN IMPENDING FAILURE OF A CIRUCIT CAUSED BY DEPOSITS OF AEROSOL

[76] Inventor: Ashok Gadgil, 438 Clayton Ave., El Cerrito, Calif. 94530

[21] Appl. No.: 907,305

[22] Filed: Jul. 1, 1992

[51] Int. Cl.[5] ..................... G01R 31/02; G01R 31/28

[52] U.S. Cl. ..................... 324/537; 324/551; 324/718; 324/158 R; 73/865.6

[58] Field of Search ............... 324/537, 556, 718, 722, 324/158 R, 500, 555, 552; 340/651; 73/865.6; 437/8; 257/48; 165/80.3

[56] References Cited

U.S. PATENT DOCUMENTS 3,842,346 10/1974 Bobbitt ............................ 324/522

OTHER PUBLICATIONS

DeGroat, P. M. et al., "Finding Short Circuits In Multilayer Printed Circuit Boards", IBM Technical Disclosure Bulletin, vol. 3, No. 3, Aug. 1970, p. 725.
Voge, J. B., "Detection of Shorting Defects By Resistance Measurement", IBM Technical Disclosure Bulletin, vol. 22, No. 6, Nov. 1979, pp. 2448–2449.

*Primary Examiner*—Gerard R. Strecker
*Assistant Examiner*—Diep Do
*Attorney, Agent, or Firm*—Fliesler Dubb Meyer & Lovejoy

[57] ABSTRACT

An impending failure of an electronic circuit caused by aerosol deposition is detected by using a test circuit including a plurality of conducting paths, aerosol deposition enhancement means, controllable means to control the aerosol deposition enhancement means, conducting path isolation sensing means to measure the isolation of the conducting paths and control means to supply a control signal to the controllable means and warn of impending test circuit failure responsive to conducting path isolation. In addition, the apparatus includes deliquescence enhancement means which is controllable and responsive to the control signal from the control means.

24 Claims, 8 Drawing Sheets

APPARATUS AND METHOD TO DETECT AN IMPENDING FAILURE OF A CIRUCIT CAUSED BY DEPOSITS OF AEROSOL

FIELD OF THE INVENTION

The present invention is directed toward improving the reliability of systems using electronic circuits. More particularly, the present invention provides an early warning of the impending failure of a circuit caused by deposits of aerosol.

DESCRIPTION OF RELATED ART

Highly integrated electronic circuits are commonly employed in modern complex electronic systems, such as digital telephone switching equipment, radar based air-traffic control systems, aviation electronics and powerful computing environments. Typically, integrated circuits are fabricated on semiconducting surfaces and enclosed in a protective package with external input/output pins. These chips or electronic components are then placed on circuit boards which are used in these complex electronic systems. Moreover, certain circuit boards are used in conjunction with other circuit boards in a piggyback fashion. This arrangement is sometimes called circuit pack. There has been a trend towards making circuit boards and packs more complex and powerful. This trend of increased complexity and power has resulted in a substantial increase in the number of electronic components placed on each board.

This increase in electronic component density has had two consequences. First, it has raised the density of heat dissipation on the circuit boards, forcing more attention to cooling the electronic components. This is usually accomplished with a forced flow of indoor air over the circuit components. Secondly, the increase in electronic component density has led to an increase in component connection density. The distance between paths for conducting electric current has substantially been decreased. These conducting paths, called traces or tracks on the printed circuit boards, and the connecting pins on the electronic components and boards are presently packed closer to each other than ever before. Typically, spacing between adjacent traces is less than a millimeter.

Indoor air is commonly laden with aerosol. The size, distribution, and the number density of indoor aerosol varies widely with time, activity in the building, and with season, if outdoor aerosol contributes significantly (as it often does) to indoor aerosol concentrations. For example, Knutson in "Modeling Indoor Concentrations of Radon's Decay Products" published as a chapter (pages 161-202), in the book "Radon and Its Decay Products in Indoor Air," edited by Nazaroff and Nero, Wiley Interscience, New York (1988), summarizes worldwide experimental data on indoor aerosol concentrations. Knutson shows that residential aerosol concentrations are commonly about 10,000 particles per cubic centimeter, with the mean diameter of the aerosol being about 0.1 micrometers. The aerosol concentration increases rapidly if cigarettes are smoked in the building, and can exceed a million particles per cubic centimeter. Sinclair, et al., show in the paper "Indoor/Outdoor Ratios and Indoor Surface Accumulations of Ionic Substances at Newark, New Jersey," published in the journal Atmospheric Environment, Volume 22, page 461 (1988), that the outdoor environment can be a major contributor to the indoor concentration of aerosol in commercial buildings.

The deposition of aerosol on indoor surfaces is driven by a variety of factors. The dominant factors determining the rate of aerosol deposition (relative to aerosol concentration in the ambient air) are: 1) gravitational settling, 2) Brownian motion (i.e. diffusion), 3) thermophoresis and 4) electrostatic drift. These factors are discussed in detail, and analyzed for aerosol of various sizes by Seinfeld in the book "Atmospheric Chemistry and Physics of Air Pollution," Wiley, New York (1986), and by Friedlander in the book "Smoke, Dust and Haze: Fundamentals of Aerosol Behavior," Wiley, New York (1977).

Deposits of corrosive aerosol on the surfaces of circuits in the indoor environment may degrade electronic equipment performance. This poses a substantial reliability concern for the electronics industry, as discussed by Comizzoli and others in the weekly Science, Vol. 234, page 340 (1986), and by Sinclair, et al., in the Journal of the Electrochemical Society, Vol. 135, page 89C (1988).

Moreover, soiling of the circuit packs or boards and the component surfaces by aerosol deposition can decrease the electrical isolation of adjacent traces and pins, which may lead to a circuit failure. For example, an electrical pulse on one pin or conducting path, which is no longer isolated due to aerosol deposits, can lead to an undesired and unanticipated change of voltage on an adjacent pin or conducting path. This connection of previously isolated circuit traces or pins may lead to circuit board malfunction or failure, and loss of system availability until the soiled circuit board or component is identified and replaced with a functional one.

Another mechanism by which soiling of aerosol can disable a circuit pack is by deliquescence of salts in the deposited aerosol. Generally, when the salts remain dry under a normal indoor environment, the circuit board functions properly. However, if the relative humidity in the indoor environment increases (e.g., by a malfunction of the air conditioning system) beyond the deliquescence point of the deposited salts, the resistance between adjacent conducting paths, now bridged by the deposited salts, drops precipitously, disabling or damaging the circuit pack.

Removal of aerosol from the indoor environment is particularly difficult for aerosol particles ranging in diameter of between 0.1 and 3 micrometers. In this range, the aerosol are too small to settle out gravitationally, i.e., they experience large aerodynamic resistance to their motion compared to the gravitational pull on them. The settling velocity of a spherical aerosol particle of diameter 0.1 micrometer and of density 1 gm/cc in normal atmospheric conditions can be shown to be about $1 \times 10^{-4}$ cm/sec. In contrast, an aerosol particle of diameter 10 micrometers has a settling velocity of about 0.2 cm/sec. On the other hand, the aerosol particles in this size range are too massive to have large diffusivities necessary for their efficient capture by diffusive deposition on filters. The diffusivity of the aerosol particle of diameter 0.1 micrometer in this example would only be $7 \times 10^{-6}$ cm$^2$/sec. In contrast, an aerosol particle of diameter 0.001 micrometer has a diffusivity of 0.02 cm$^2$/sec. The only effective method for removal of all aerosol, including those in this size range, from the indoor environment is with the use of High Efficiency Particle (HEPA) filters, and by a simultaneous rigid control of all sources of aerosol in the indoor environment, including the personnel and equipment, as practiced, for example, in clean rooms in the production of integrated electronic circuits. In most circumstances, this level of control over the indoor environment is too expensive or impractical.

Air is commonly passed through filters when it is circulated in buildings housing circuit packs (e.g., telephone switching offices). However, the efficiency of these filters is low, and outside aerosol commonly pass into the indoor environment. Furthermore, there are local (i.e. indoor) sources of aerosol inside the buildings. For example, sparking of brushes on electric motors commonly produces a large quantity of aerosol that is readily detectable in the indoor environment (e.g. see Knutson, Op. Cit.). Furthermore, the indoor air for cooling the electronic equipment is often drawn through filters before sending it across the circuit boards. However, these filters also are inadequate for efficiently removing aerosol in the diameter range 0.1 to 3 micrometers.

There are methods for cleaning and restoring to functionality, if possible, the circuit packs disabled by aerosol deposition. These methods usually involve removing the circuit pack from its system, and cleaning it with suitable solvents, sometimes with the aid of ultrasonic agitation. It would be desirable if the aerosol deposits could be cleaned before they accumulate to such a degree that they threaten system reliability, or cause damage to the circuit pack.

However, the indoor aerosol number concentration, size distribution, and composition can vary over the seasons, and also episodically by large magnitudes (e.g. by factors of 1000, as mentioned in data summarized by Knutson, Op. Cit.). The soiling rate of the circuit packs therefore also varies by comparable ranges. Therefore, it has been impractical to establish a standard time duration after which all circuit packs in a given building should go through the cleaning cycle.

Sinclair, et al., demonstrate in the paper "Deposition of Airborne Sulfate, Nitrate, and Chloride Salts as it Relates to Corrosion of Electronics" in Journal of the Electrochemical Society, Vol. 137, page 1200, (1990), that the airborne concentrations of the major corrosive ionic substances in different equipment rooms of a given building do not vary much (less than ±15% from the average). They attribute the variability in the deposition rates of these substances on various electronic components to different levels of factors controlling the deposition (as discussed earlier: gravitational settling, thermophoresis, diffusive deposition, and electrostatic drift).

Therefore, what would be desirable is a means for accelerating the deposition of aerosol from the indoor air in the equipment building onto a test circuit in the same building, and measuring the degradation of the electrical performance of the test circuit, with and without change in relative humidity. The test circuit would model, as closely as possible, the conducting path characteristics of the circuits which are to be monitored. The degradation of the test circuit can be monitored simply by measuring the electrical isolation of adjacent traces on the test circuit. This monitoring would allow the generation of an early warning signal alerting the responsible personnel to the need for cleaning all the operational circuit packs in the building (and also the test circuit, so the process can start all over again). Since the aerosol deposition on the test circuit would be from the same environment as the operating circuit packs, the degradation of the test circuit would predict the impending effects of episodic and seasonal changes in aerosol concentration and chemical composition, affecting the circuit pack performance.

SUMMARY OF THE INVENTION

The present invention provides an apparatus for detecting an impending failure of a circuit by enhancing the aerosol deposition on a test circuit with a plurality of conducting paths. The aerosol deposition on the test circuit is enhanced by aerosol deposition enhancement means. Moreover, sensing means which measures the conducting path isolation is coupled to the test circuit. Information (including an alarm signal) is then supplied to the operating personnel in response to the measured conducting path isolations.

According to another aspect of the invention, the present invention further comprises deliquescence enhancement means which are coupled to the test circuit and controllable in response to at least one control signal from the control means.

BRIEF DESCRIPTION OF THE DRAWINGS

FIG. is a diagram of the present invention, showing the various functional constituents to enhance aerosol deposition on the test circuit.

DETAILED DESCRIPTION OF THE INVENTION

Figure 1:
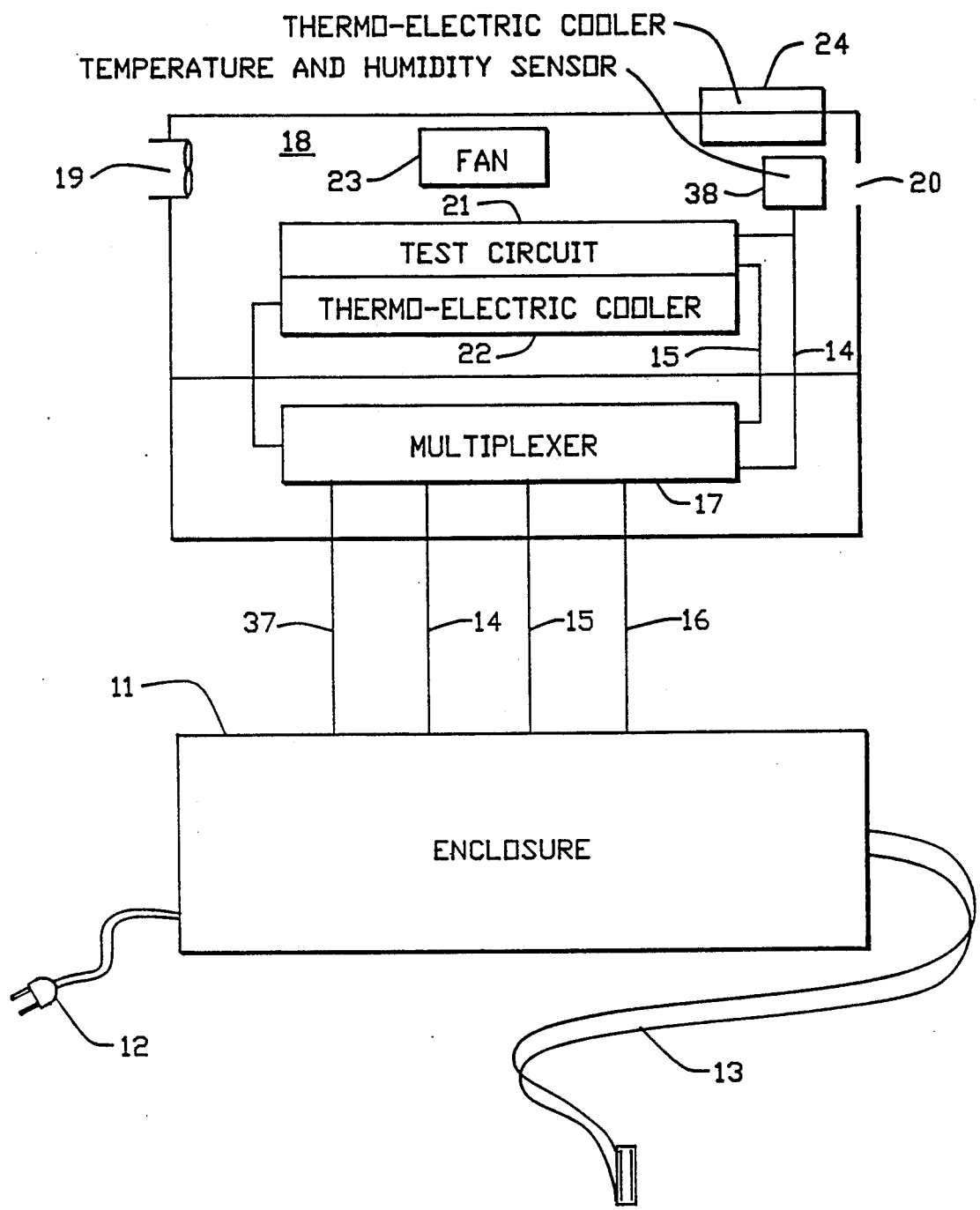

Referring now to FIG. 1, the apparatus of the invention is shown comprising a test circuit 21 which is exposed to the indoor air bearing aerosol. One embodiment accomplishes this by enclosing test circuit 21 in enclosure 18 with a fan powered inlet 19 and exhaust 20. Closely spaced conductors on the test circuit 21 are connected to isolation-measuring circuits, which may be enclosed separately in another enclosure 11, by means of connecting signal wires 14 routed through a multiplexer 17, which may be a PCLD-788 Relay Multiplexer Board supplied by Advantech. Electrostatic drift is imposed on aerosol depositing on the test circuit 21 by applying high positive and negative voltages to the closely spaced conductors, which may be conveyed to the test circuit by means of high voltage lines 15, through the multiplexer 17. The connections in the multiplexer 17 may be altered by addresses conveyed to the multiplexer via address lines 16. Circuits in enclosure 11 may be powered from the power source 12, and may communicate the results of their measurements via a modem, a display panel, an alarm, or by sending their data to another computer via a standard communication cable 13, such as an RS-232. The test circuit is cooled by a thermo-electric cooler 22. The surrounding air of the test circuit can be cooled by another thermo-electric cooler 24. Turbulence is generated in the surrounding air of the test circuit by a fan 23. Power is supplied to the multiplexer 17, and the thermoelectric coolers 22 and 24, and fans 19 and 23 through power supply cables 37. Connections not shown. Temperature and humidity sensors 38 are connected through signal wires 14 and multiplexer 17 to temperature and humidity measuring circuits housed in enclosure 11. Note that multiplexer 17 is housed separately within enclosure 18 so as to protect it from excessive contamination to which test circuit 21 may get exposed.

Figure 2:
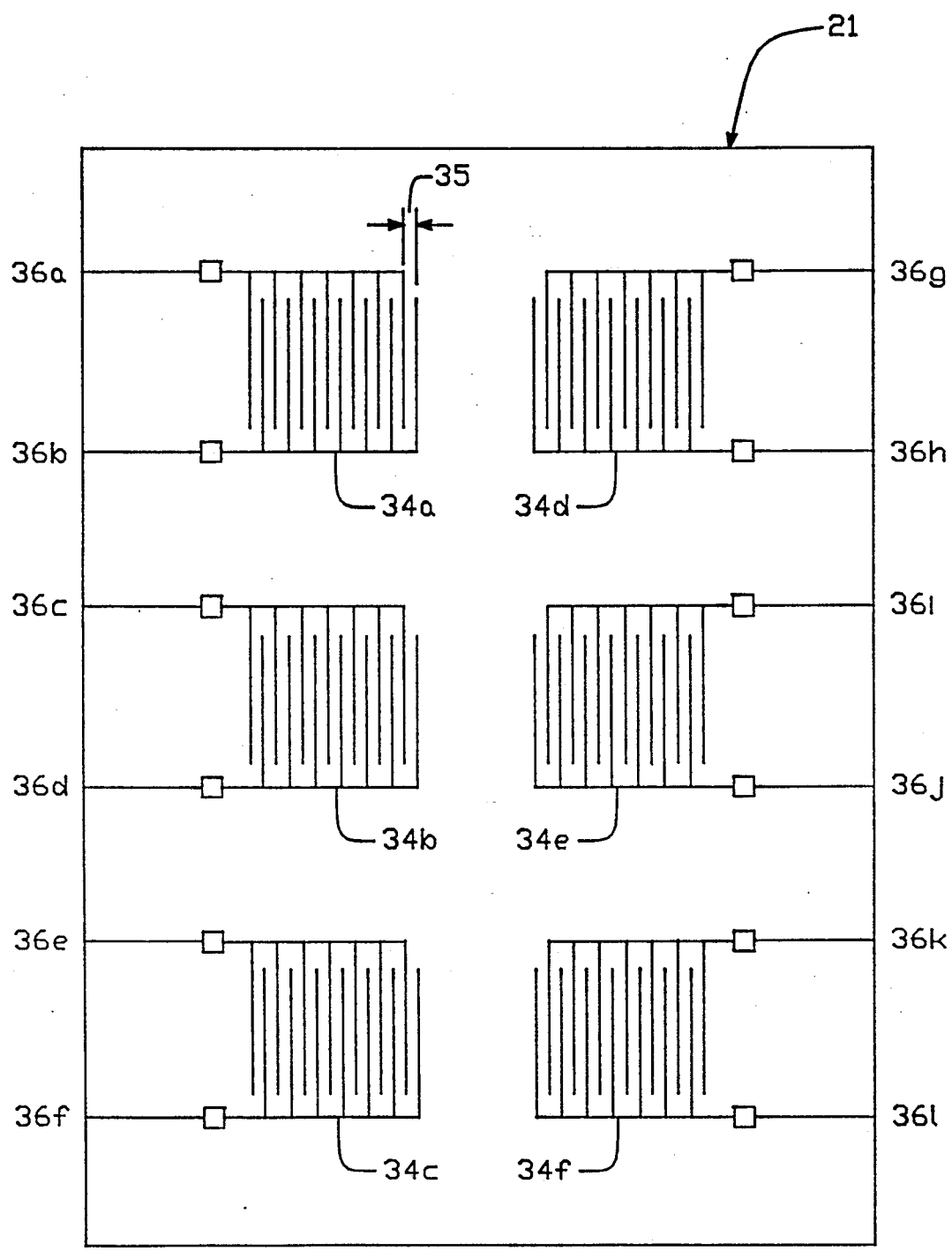
FIG. 2 is a view of a typical test circuit and its various connections.

FIG. 2 is an enlarged top view of test circuit 21 which is shown in FIG. 1. A plurality of adjacent conducting pairs of traces 34a-f are shown. The nonconducting inter-trace spacing, 35, separating the two conducting traces within each pair (e.g., in 34a) may be all identical or variable. In the latter case, a sequence of trace-pairs with progressively increasing inter-trace spacing (i.e., the spacing between the conductors within each pair) can be used to generate a sequence of impending-failure signals. Each signal being generated by the shortcircuiting (owing to aerosol deposition) of progressively larger inter-trace spacing, and providing a warning of increasing likelihood of failure of other circuits exposed to the same environment. A large number of pairs, such as 25, may be used to obtain a statistical estimate of aerosol deposition.

If uniform inter-trace spacing is used, it should be selected such that it is slightly less than the conducting path spacing in the actual electronic circuit being modeled. Likewise, the voltage differential applied to each trace pair, through contacts 36a-l, can be either uniform or progressively larger. In the latter case, the progressively larger voltage imposes progressively larger electrostatic drift accelerating aerosol deposition. This can be used, in a manner similar to that discussed above, to generate a sequence of signals, providing warnings of increasing likelihood of failure of other circuits exposed to the same environment. If uniform voltage difference is applied to all trace pairs, it should be slightly higher than maximum voltage differential across the modeled circuits. Contacts 36a-l are also used to measure inter-trace isolation via multiplexer 17 and isolation measurement circuits housed in enclosure 11. These are not shown in FIG. 2.

Figure 3:
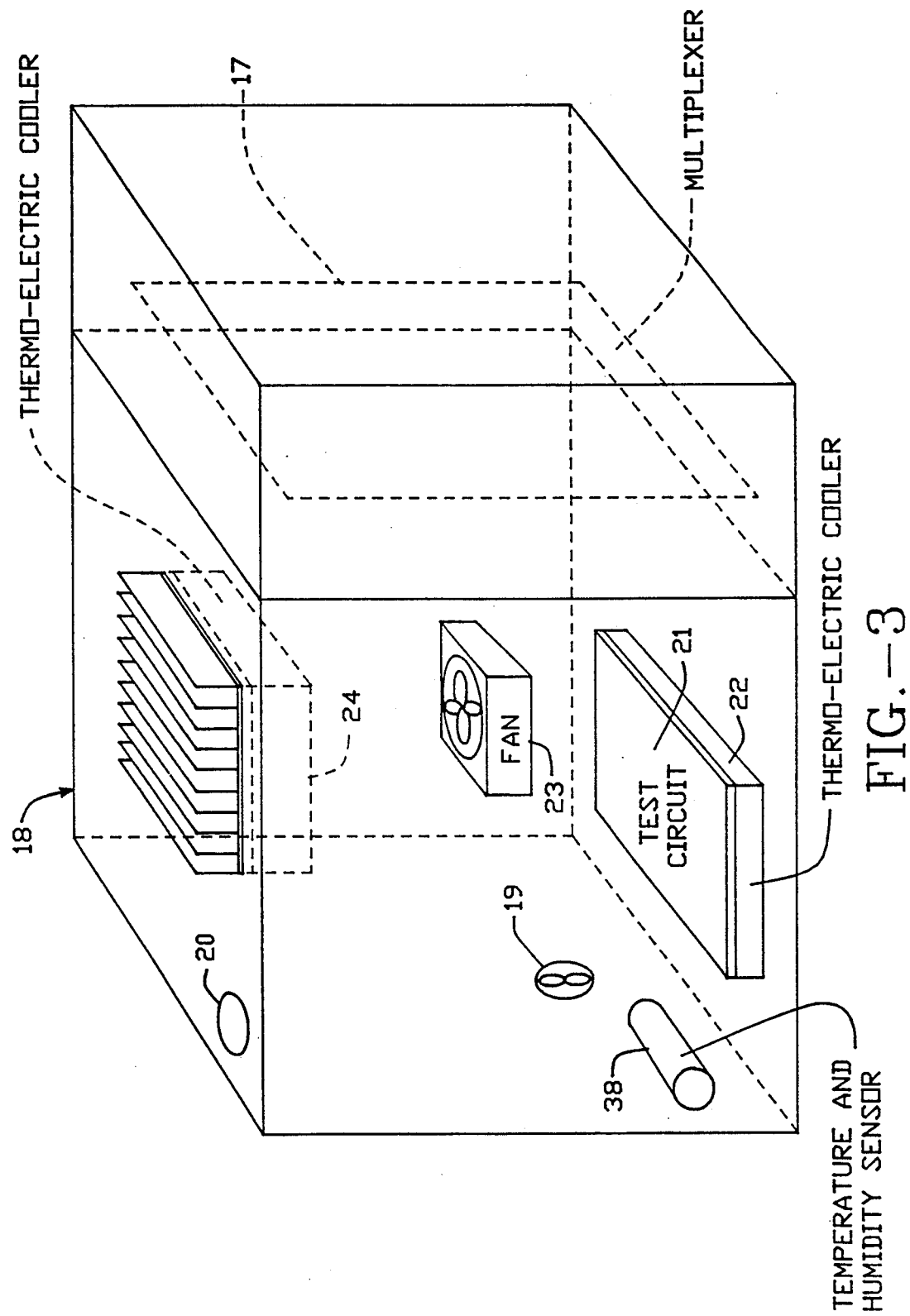
FIG. 3 is a three-dimensional diagram of one embodiment of the present invention in FIG. 1.

Referring now to FIG. 3, the test circuit 21 is located on the cooling side of a thermo-electric cooler 22, which may also be powered through the multiplexer 17. Power, signal and control lines are not shown for clarity. The temperature and relative humidity sensors 38 are placed in the air surrounding the test circuit 21, and may send their measured signal via the multiplexer 17 over signal lines 14 to the measurement and control circuits 31 and 33 which may be housed in enclosure 11. A turbulence generator fan 23 blows air onto the test circuit. This reduces the thickness of the aerodynamic boundary layer on the test circuit and ensures good availability of the aerosol on the outside of the aerosol boundary layer on the test circuit board, thus ensuring enhancement of the deposition rate. Thermo-electric cooler 24 is located to extract heat from the air surrounding the test circuit thus raising the relative humidity of the air surrounding the test circuit when desired. At such times, the intake fan 19 is switched off to allow ease in raising humidity. Exhaust 20 may also be closed for this duration.

Figure 4:
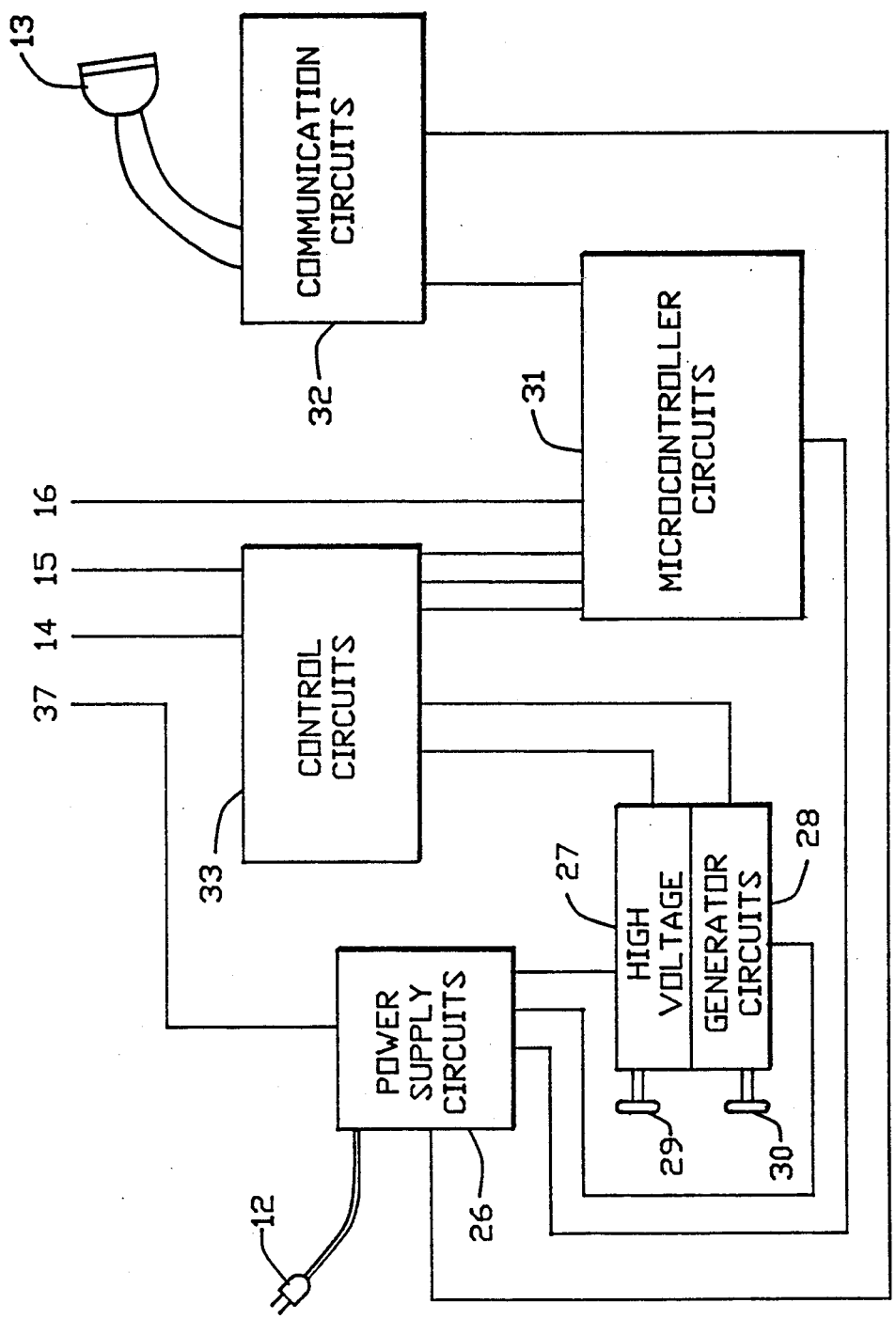
FIG. 4 is an electrical block diagram of the power, micro-controller, measuring, and communications circuits shown in FIG. 1.

In FIG. 4, the power supply circuits 26, such as a unit SSD 15-12 supplied by Sorensen Power Supplies, receives power from power source 12, and supplies power to microcontroller circuits 31, control circuits 33, communication circuits 32, and various equipment housed in enclosure 18 of FIG. 1. It also passes 110V power supply to high voltage generator circuits, 27 and 28, whose outputs can be user set via knobs or controls 29 and 30. The output voltages from the high voltage generator circuits, 27 and 28, are passed on to the multiplexer 17 in FIG. 1, via control circuits 33, which may be an array of DPDT relays supplied by Archer Electronics. The power supply circuits 26 also supplies power to the micro-controller circuits 31, such as a "Tiny Giant" supplied by Z-World Engineering. Address lines 16 connect micro-control circuits 31 to the multiplexer 17. Additional address and signal lines connect the microcontroller circuits 31 to the control circuits 33. Finally, results from the measurements of the test circuit and its environment, after suitable processing, are passed by the micro-controller circuit 31 to the communication device 32, also powered by the power supply 26. The communication device 32, such as that integrated with the Tiny Giant supplied by Z-World Engineering, may convey the results of the measurements over a modem, by a display, or over an RS-232 line 13, shown in the FIG. 4. Circuits shown in FIG. 4 are housed in enclosure 11 of FIG. 1, and are connected to the multiplexer and other equipment in enclosure 18 through signal wires 14, power supply cable 37, high voltage lines 15, and address lines 16. Isolation of conducting trace pairs on the test circuit 21 of FIG. 2 is measured by measurement of the voltage drop across the trace pair (e.g., across 36a and 36b of FIG. 2) when supplied with a standard voltage through a known resistance. This is carried out by the microcontroller circuit 31. Relative humidity and temperature signals are transmitted by relative humidity and temperature sensors 38 of FIG. 3 as voltages, which are measured by the microcontroller circuit 31.

Figure 5:
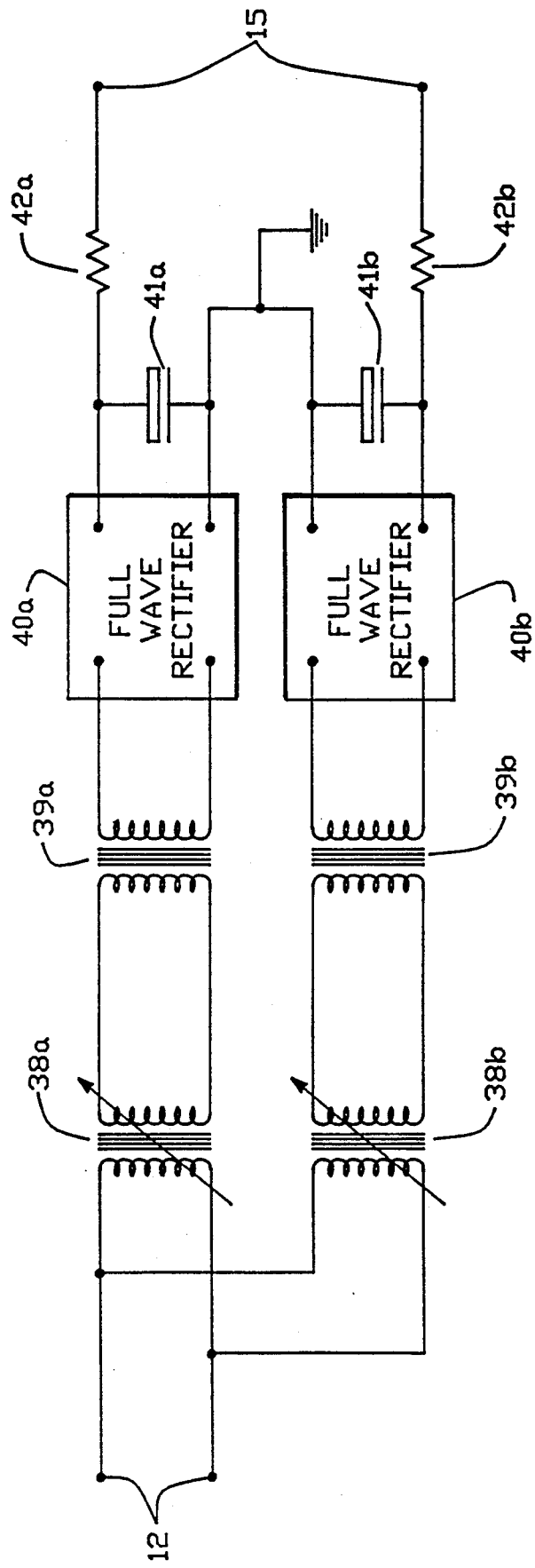
FIG. 5 is a schematic of the high voltage generator circuits which supply user-defined high positive and negative voltages to the conducting paths of the test circuit.

FIG. 5 is a schematic of the high voltage generator circuit 27 and 28 with typical resistance, capacitance values. 110 VAC power is supplied to the circuits from the power source 12 of FIGS. 1 and 4, which may be routed through the power supply 26 of FIG. 4. Two variable transformers, 38a, and 38b, each provide output voltage between 0 and 10V, according to the user-set control knobs 29 and 30 of FIG. 4. A step-up transformer 39a triples the supplied voltage (up to 330V max), and the step-down transformer 39b reduces it by a factor of 2.0 to 55 volts max. Outputs from each of the transformers are supplied to full-wave rectifiers 40a and 40b. Their outputs are smoothed with electrolytic capacitors 41a and 41b, of 47 $\mu$F each. Resistances 42a of 1 Mega-ohm and 42b of 100 kilo-ohm are placed after the capacitors to limit current drains. Output of the circuit is a variable, user-settable, high positive voltage (+330 Volts max) and a user-settable high negative voltage (−55 Volts max). These are passed through controlling circuits 33 of FIG. 4 to high-voltage line 15 of FIG. 4.

Figure 6:
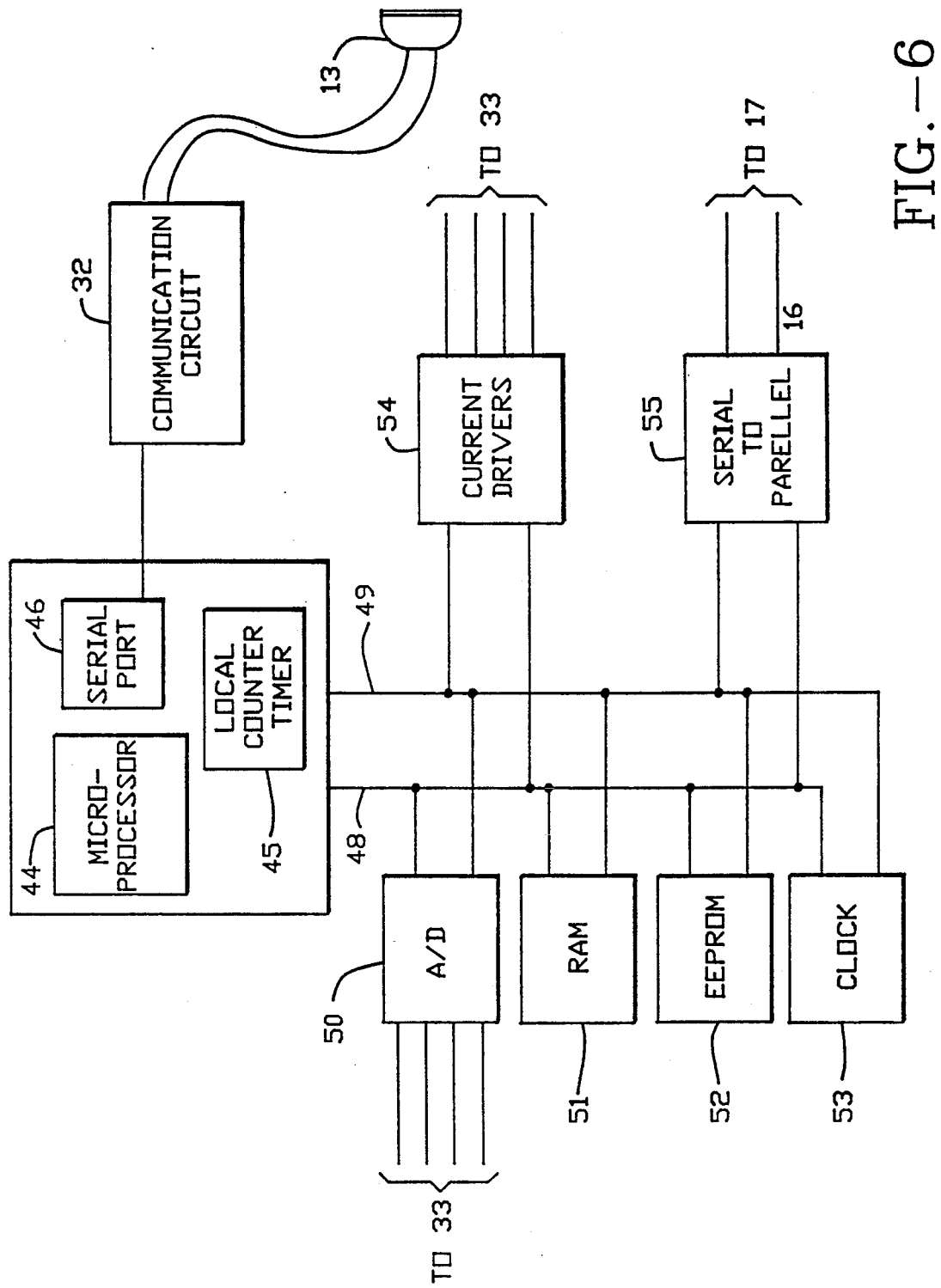
FIG. 6 is a detailed electronic block diagram of the micro-controller shown in FIG. 1.

FIG. 6 shows the functional blocks comprising the micro-controller circuit-31, such a device may be a Tiny Giant supplied by Z-World Engineering. "Tiny Giant" incorporates all the components shown in FIG. 6 on a single board. The micro-processor 44, and the local counter-timer 45 are connected to other parts of the circuit via data lines 48, and address lines, 49. The serial port 46 of the micro-processor is connected to the communication circuits 32, which may be externally connected to a phone line via a modem, a local display or alarm, or a communication line 13.

The data and address lines, 48 and 49, connect to analog-to-digital conversion circuits, 50, with operational amplifiers as signal conditioners. These circuits may be multichannel, and receive signals through the control circuits 33. The random access memory is in block 51, the electrically programmable-erasable memory (EPROM) containing the control program is in block 52, a battery powered time and date clock is in block 53, current drivers to act as current sinks for controlling relays in the control circuits 33, are housed in block 54, and external address lines 16 to control the multiplexer 17 are passed out through parallel output lines in block 55.

The operation of the apparatus of the invention can now be described in three phases as follows:

1) Phase 1. (Typically, operational most of the time.) Pairs of adjacent conducting traces on the test circuit board are supplied with high positive and negative voltages to enhance deposition of aerosol on them by electrostatic drift. For example, contacts 36a, 36c, 36e, 36g, 36i, and 36k may be supplied with positive voltages, and contacts 36b, 36d, 36f, 36h, 36j, and 36l (of FIG. 2) may be supplied with negative voltages. (These voltages are not large enough to cause an electrical discharge or arcing, and are typically on the order of 300 volts.) During this time, the test circuit board is exposed to indoor air assisted by air intake fan 19, with fan 23 running to ensure good transport of aerosol to the outer edge of the aerosol boundary layer on the test circuit board. Also, during this time, power is supplied to thermo-electric cooler 22 so as to keep the test circuit board cooler than the environmental air by a few degrees (typically on the order of 5° C.) The thermo-electric cooler 24 is kept off. The aerosol deposition enhancement by accelerated electrostatic drift is a function of size and charge distribution of the environmental aerosol. Similarly, the deposition enhancement by thermophoretic effect is a function of aerosol size, density and conductivity. Since these are different in different indoor environments, the net magnitude of aerosol deposition enhancement on the test circuit board (over the aerosol deposition rate on other circuits in the same environment) would need to be initially calibrated with tests.

2) Phase 2. (Typically, operated every 10 minutes.) The high voltages supplied to the conducting traces 36a-l are switched off. Isolation of conducting traces within each pair (e.g., 34a) is measured by the microcontroller circuits 31 connecting to the traces via control circuits 33, the multiplexer 17, and signal wires 14. The resistance data are collected and stored in the RAM on microcontroller circuit 31 for later processing, evaluation, and communication.

3) Phase 3. (Typically, operational every 24 hours.) The air intake fan 19 is switched off and air exhaust port 20 is closed, the thermo-electric cooler 22 is switched off, and the high voltage supply to the conducting traces 36a-l is also switched off. Thermoelectric cooler 24 is switched on. Fan 23 continues to be powered to ensure good mixing of the air, and extraction of heat from it by cooler 24. The relative humidity and temperature sensors 38 send measurement of relative humidity and temperature of air surrounding the test circuit board via the multiplexer 17 over signal lines 14 through control circuits 33 to the microcontroller circuits 31. The thermo-electric cooler 24 is operated until either the relative humidity of air in enclosure 18 reaches a high set-point (which may be as high as 90% RH) to ensure deliquescence of any deposited or formed salts, or the air temperature in enclosure 18 is lowered so much (e.g., to say 5° C.) before reaching 90% RH that it is reasonable to assume that the indoor air is very dry and that deliquescence would not be a problem in the event of a malfunction of the air conditioning system. Under such conditions of high relative humidity, the resistance across adjacent trace pairs is measured again by microcontroller circuits 31, and reported to the outside monitor, if its value is low enough to warrant attention.

Figure 7:
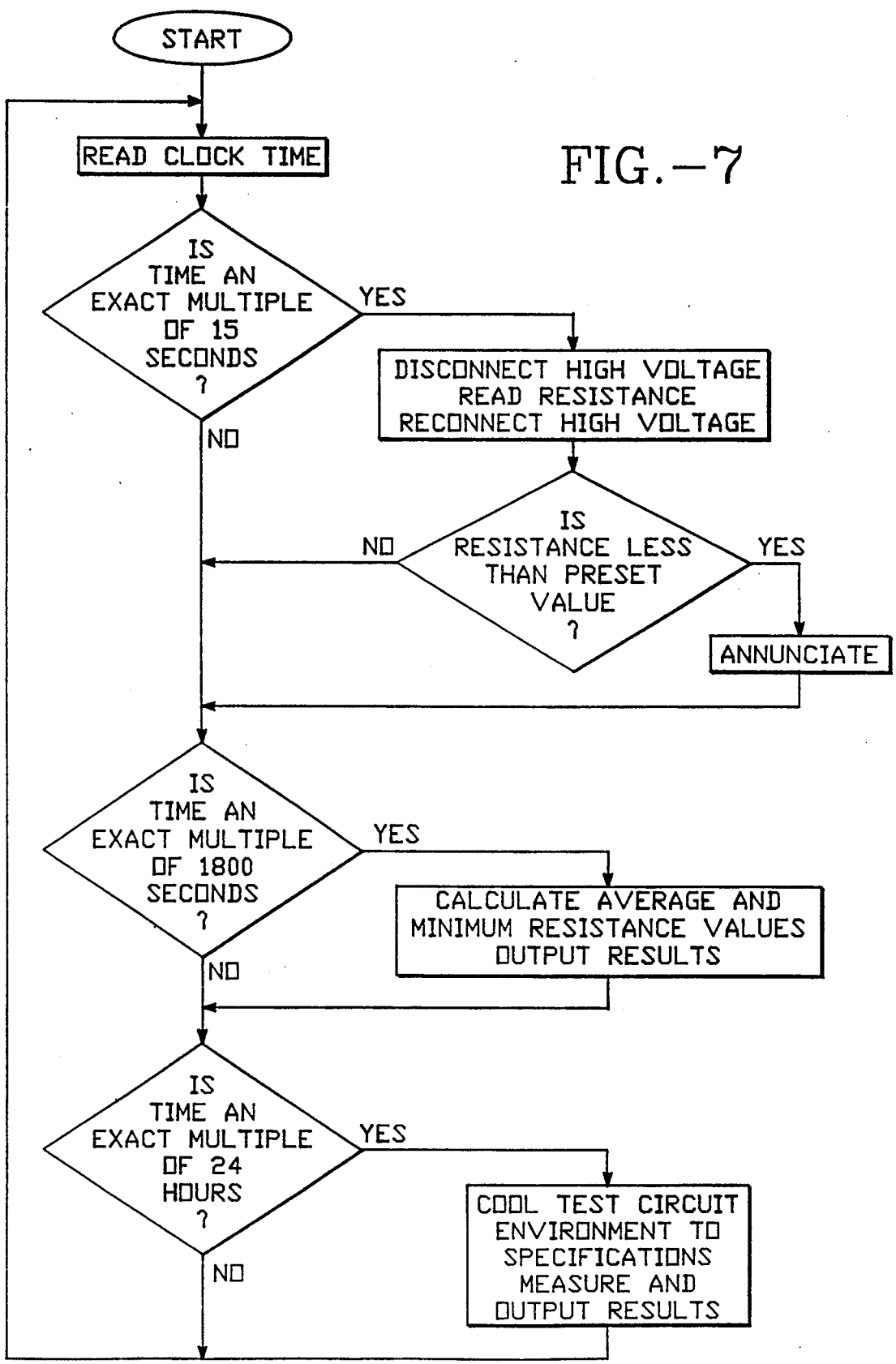
FIG. 7 is a flow chart of the control program used in the micro-controller of FIG. 6.

FIG. 7 is a flow chart of the computer program used in micro-controller 31. As can be seen from FIG. 7, every 15 seconds the conducting traces on the test circuits are disconnected from high voltage and their isolation resistance (i.e., resistance of gap 35 of FIG. 2) is read. The high voltage is then reconnected. Multiple samples are collected. Every 1,800 seconds, the average and minimum resistance values are calculated. The results are then compared with a predetermined threshold value (obtained from calibration tests or other means). At 24-hour intervals, the relative humidity of the surrounding air of the test circuit is increased to 90%, or the temperature is decreased to 5° C. (whichever occurs first). The resistance between the conducting paths is then measured and compared to a preset value (e.g., 1 mega ohm) which may have been obtained from calibration tests or other means. If the resistance is found below the preset value, a warning or alarm signal is then sent along with information on the distribution of measured resistances.

Figure 8:
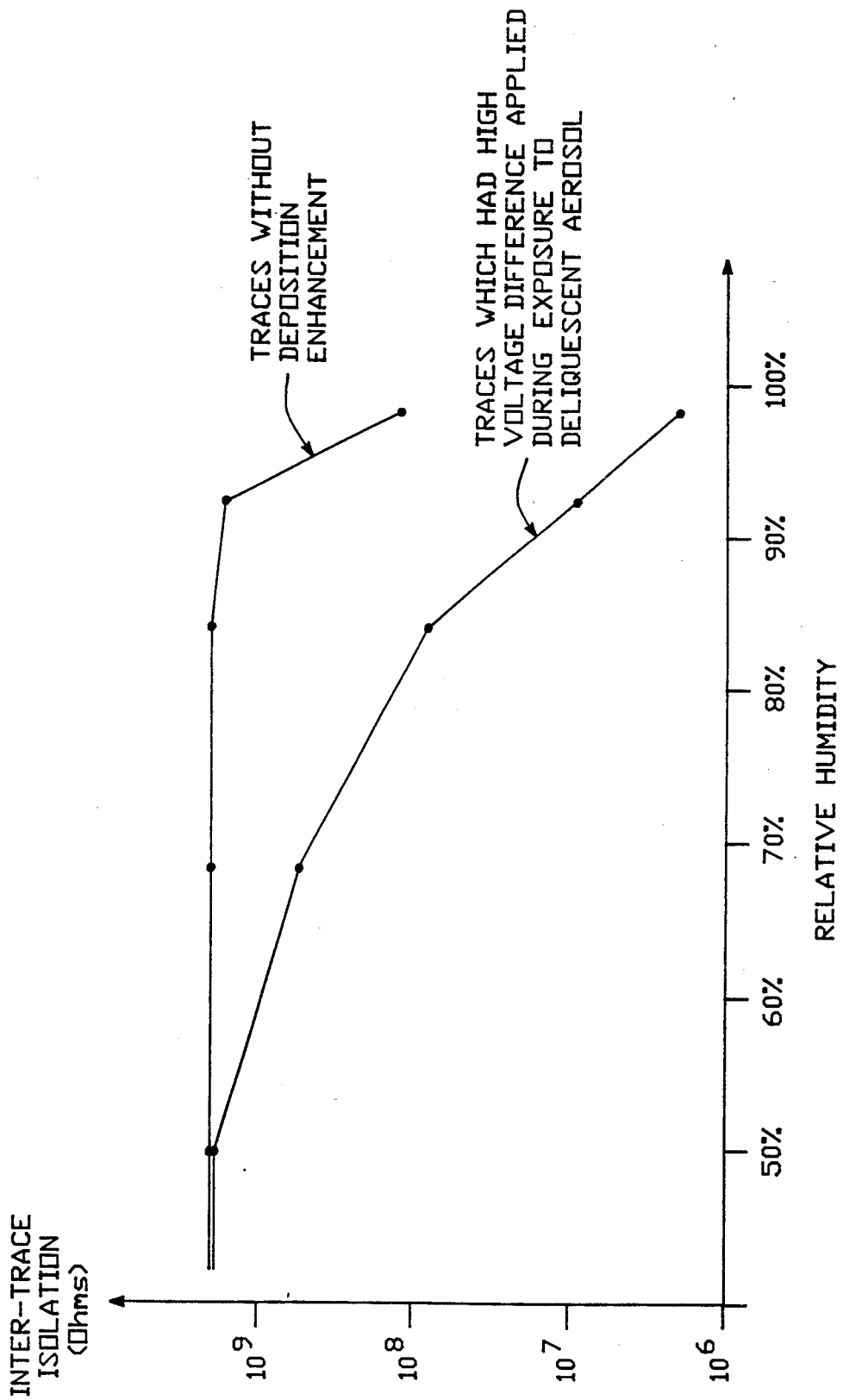
FIG. 8 is a graph showing the decrease in electrical isolation of two pairs of adjacent traces on a test circuit pack over a range of relative humidities, after the test circuit is exposed to a high number concentration of ionic aerosol containing sulfates and chlorides. One pair of traces has the deposition enhanced by electrostatic drift, the other had no such drift imposed.

FIG. 8 shows the relationship between enhanced and normal deposition of deliquescent aerosol and electric isolation as a function of relative humidity.

A very weak solution of sodium chloride and magnesium sulphate in water was supplied to an ultrasonic aerosol generator. The resulting aerosols were transported through a pipe (diameter 10 cm, length 2.5 m) along an air current. The pipe contained electrical heaters to lower the relative humidity and dry the aerosols to solid particles. The aerosols then entered an exposure chamber that contained two identical sets of closely-spaced conducting trace pairs (such as, 34a and 34b of FIG. 2), and from that chamber the aerosol-laden air current was exhausted to the outdoors. The two identical trace-pairs differed in only one respect. One was connected to a high voltage difference applied across its insulating gap: +300V and −50V; the other was not connected to any external circuit.

After an exposure of 24 hours to the aerosol, both the trace-pairs showed a similar and repeatable decline in their isolation when they were subsequently exposed to high relative humidity.

However, if the exposure was for a shorter duration (say 12 hours), the trace-pair supplied with high-voltage during the exposure displayed a distinctly different decline in its isolation compared to the trace-pair that was left disconnected. FIG. 8 shows the inter-trace resistance for the two pairs of conducting traces, as a function of relative humidity. The trace-pair supplied with high voltage differential during exposure shows enhanced sensitivity (isolation degradation) to increased relative humidity: a result of enhanced aerosol deposition owing to electrostatic drift.

If both the trace-pairs are exposed to aerosol for 24 hours, their isolation decline with relative humidity becomes similar. This is owing to the substantial deposition of deliquescent aerosols in the gaps between the trace-pairs. So much aerosols deposit in this aerosol-laden environment in 24 hours that even the electrically neutral trace-pair gets large aerosol deposits, and its isolation declines with relative humidity just as that of the trace-pair exposed with a high-voltage differential applied across it.

FIG. 8, shows that under certain conditions, it is possible to enhance deposition of certain commonly occurring deliquescent salt aerosols onto test circuits by means of electrostatic drift, and that these test-circuits will display a degradation in their isolation with increasing relative humidity before other, normal circuits exposed to the same environment would.

What is claimed is:

1. An apparatus for detecting an impending failure of a circuit, comprising:
   a chamber;
   a voltage source providing a voltage potential;
   a test circuit, having a first trace with a first contact and a second trace with a second contact, enclosed in the chamber;
   aerosol deposition enhancement means, coupled to the chamber, for enhancing aerosol deposition onto the test circuit;
   controllable means, coupled to the aerosol deposition enhancement means, for controlling the aerosol deposition enhancement means, in response to at least a first control signal;
   sensing means, coupled to the test circuit and the voltage source, for (1) providing the voltage potential between the first contact and the second contact, responsive to a second control signal, and (2) providing a measured resistance value between the first and the second trace; and
   control means, coupled to the controllable means and the sensing means, for providing (1) the at least first control signal at a first predetermined time, (2) the second control signal at a second predetermined time, and (3) providing an impending circuit failure warning signal responsive to a comparison of the measured resistance value and a predetermined value.

2. An apparatus of claim 1, wherein the aerosol deposition means further includes:
   deliquescence enhancement means, coupled to the chamber, for enhancing deliquescence of aerosol on the test circuit.

3. An apparatus of claim 2, wherein the test circuit includes:
   the first trace uniformly spaced from the second trace.

4. The apparatus of claim 1, wherein the test circuit includes:
   a first, second, third and fourth trace, having a first spacing between the first and second trace and a second spacing between the third and fourth trace.

5. The apparatus of claim 1, wherein the aerosol deposition enhancement means includes:
   means, coupled to the first trace, the second trace, and the voltage source, for generating a high voltage potential between the first and second trace providing electrostatic drift on the test circuit;
   means, coupled to the chamber, for directing sampled air transporting aerosol toward the test circuit;
   a first cooling means, coupled to the test circuit, for cooling the test circuit.

6. The apparatus of claim 2, wherein the deliquescence enhancement means includes:
   means for increasing the relative humidity surrounding the test circuit.

7. The apparatus of claim 6, wherein the means for increasing the relative humidity surrounding the test circuit includes:
   a second cooling means, coupled to the chamber, for reducing air temperature surrounding the test circuit;
   a humidity sensing means, coupled to the controllable means, for measuring air humidity surrounding the test circuit.

8. The apparatus of claim 6, wherein the means for increasing the relative humidity surrounding the test circuit includes:
   means coupled to the chamber, for adding water vapor to the air surrounding the test circuit; and
   a humidity sensing means, coupled to the controllable means, for measuring air humidity surrounding the test circuit.

9. The apparatus of claim 7, wherein the first and second cooling means includes:
   a thermo-electric cooler.

10. The apparatus of claim 8, wherein the means for adding water vapor to the air includes:
    an evaporator or a humidifier.

11. The apparatus of claim 1, wherein the control means includes:
    a micro-controller circuit providing a comparison between the measured resistance value and the predetermined value; and
    a communication circuit, coupled to the micro-controller circuit, providing an impending circuit failure warning signal in response to the comparison.

12. An apparatus for detecting an impending failure of a circuit pack or the like, comprising:
    a chamber;
    a voltage source providing a voltage potential;
    a test circuit having a first trace with a first contact and a second trace with a second contact, enclosed in the chamber;
    a first cooling means, coupled to the test circuit, for cooling the test circuit;
    means, coupled to the chamber, for directing sampled air transporting aerosol toward the test circuit;
    means, coupled to the first trace, second trace and voltage source, for generating a high voltage potential, between the first and second trace providing an electrostatic drift force on the aerosol;
    a second cooling means, coupled to the chamber, for reducing air temperature surrounding the test circuit;
    controllable means, coupled to the test circuit, first cooling means, means for directing sampled air, means for generating high voltage, and second cooling means, for controlling the first and second cooling means, means for directing sampled air, and means for generating high voltage, in response to at least a first control signal;

sensing means, coupled to the test circuit and the voltage source, for providing (1) a voltage potential between the first contact and the second contact, responsive to a second control signal, and (2) providing a measured resistance value between the first trace and second trace; and control means, coupled to the controllable means and the sensing means, for providing (1) the at least first control signal at a first predetermined time, (2) the second control signal at a second predetermined time and (3) providing an impending circuit pack failure warning signal responsive to a comparison of the measured resistance value and a predetermined value.

13. An apparatus of claim 12, wherein the first and the second cooling means includes:
a thermo-electric cooler.

14. An apparatus of claim 12, wherein the means for directing sampled air includes:
a fan.

15. The apparatus of claim 12, wherein the control means includes:
a micro-controller circuit providing a comparison of the measured resistance value and the predetermined value; and
communication circuit, coupled to the micro-controller circuit, providing an impending circuit pack failure warning signal in response to the comparison.

16. The apparatus of claim 12, wherein the test circuit includes:
the first trace uniformly spaced form the second trace.

17. A method for detecting an impending failure of a circuit having a corresponding test circuit which includes a first trace having a first contact and a second trace having a second contact, comprising the steps of:
enhancing deposition of aerosol between the first trace and the second trace;
measuring the resistance between the first contact and the second contact;
comparing the measured resistance to a predetermined value; and
warning of the impending circuit failure responsive to the comparison of the measured resistance and the predetermined value.

18. The method of claim 17, further comprising the steps of:
enhancing deliquescence of aerosol on the test circuit.

19. The method of claim 17, wherein the enhancing deposition of aerosol includes the steps of:
providing a high voltage potential between the first contact and the second contact.

20. The method of claim 18, wherein the enhancing deliquescence of aerosol includes the step of:
increasing the relative humidity of air surrounding the test circuit.

21. The method of claim 18, wherein the enhancing deliquescence of aerosol includes the steps of:
cooling air surrounding the test circuit; and
mixing air surrounding the test circuit.

22. The method of claim 19, wherein the enhancing deposition of aerosol further includes the step of:
providing sampled directed air toward the test circuit;
cooling the test circuit; and
increasing the turbulence of the sampled directed air adjacent tot he test circuit.

23. An apparatus for detecting an impending failure of a circuit, comprising:
a chamber;
a signal source providing a signal;
a test circuit, having a first trace with a first contact and a second trace with a second contact, enclosed in the chamber;
aerosol deposition enhancement means, coupled to the chamber, for enhancing aerosol deposition onto the test circuit;
controllable means, coupled to the aerosol deposition enhancement means, for controlling the aerosol deposition enhancement means, in response to at least a first control signal;
sensing means, coupled to the test circuit and the signal source, for (1) providing the signal between the first contact and the second contact, responsive to a second control signal, and (2) providing a measured value between the first and the second trace; and
control means, coupled to the controllable means and the sensing means, for providing (1) the at least first control signal at a first predetermined time, (2) the second control signal at a second predetermined time, and (3) providing an impending circuit failure warning signal responsive to a comparison of the measured value and a predetermined value.

24. A method for detecting an impending failure of a circuit having a corresponding test circuit which includes a first trace having a first contact and a second trace having a second contact, comprising the steps of:
enhancing deposition of aerosol between the first trace and the second trace;
measuring the impedance between the first contact and the second contact;
comparing the measured impedance to a predetermined value; and
warning of the impending circuit failure responsive to the comparison of the measured impedance and the predetermined value.

* * * * *